United States Patent

Kukla et al.

(10) Patent No.: US 7,091,889 B2
(45) Date of Patent: Aug. 15, 2006

(54) SPEED AND MEMORY OPTIMIZED INTERLEAVING

(75) Inventors: Ralf Kukla, Nürnberg (DE); Stefan Schütz, Wiesenthau (DE); Georg Spörlein, Hirschaid (DE); Gerd Mörsberger, Bubenreuth (DE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 10/526,519

(22) PCT Filed: Sep. 9, 2002

(86) PCT No.: PCT/EP02/10073

§ 371 (c)(1),
(2), (4) Date: Mar. 3, 2005

(87) PCT Pub. No.: WO2004/025839

PCT Pub. Date: Mar. 25, 2004

(65) Prior Publication Data

US 2005/0248473 A1    Nov. 10, 2005

(51) Int. Cl.
*H03M 7/00* (2006.01)
(52) U.S. Cl. .......................................... 341/81; 341/50
(58) Field of Classification Search ................. 341/81, 341/82, 51, 59, 61; 714/701, 755, 786
See application file for complete search history.

(56) References Cited

U.S. PATENT DOCUMENTS 4,394,642 A * 7/1983 Currie et al. ................. 341/81
6,323,788 B1 * 11/2001 Kim et al. .................... 341/81
6,347,385 B1    2/2002 Cui et al.
6,392,572 B1    5/2002 Shiu et al.
6,404,360 B1 * 6/2002 Piret et al. .................... 341/81
6,603,412 B1 * 8/2003 Gatherer et al. .............. 341/61
6,670,898 B1 * 12/2003 Lifshitz ....................... 341/81
6,774,825 B1 * 8/2004 Bliss et al. ................... 341/81
2004/0056786 A1 * 3/2004 Bliss et al. ................... 341/81

FOREIGN PATENT DOCUMENTS

| EP | 1030455 A | 8/2000 |
| EP | 1111797 A | 6/2001 |
| EP | 1195910 A | 4/2002 |
| EP | 1111797   | * 6/2002 |

OTHER PUBLICATIONS

European Patent Office, International Search Report for PCT/EP02/10073, dated Feb. 20, 2003.

* cited by examiner

*Primary Examiner*—Linh V. Nguyen
(74) *Attorney, Agent, or Firm*—Roger Burleigh

(57) ABSTRACT

This invention relates to a method for interleaving, according to an interleaving scheme, an input sequence comprising K bits into an interleaved sequence, comprising the steps of (a) storing the input sequence in a first memory means, (b) generating first indices of N succeeding bits of the interleaved sequence, wherein 1 m(F) N m(F) K, (c) converting, according to an inverse of said interleaving scheme, said first indices into second indices indicative of the positions where said N succeeding bits of the interleaved sequence are stored in said first memory means, and (d) reading out said N succeeding bits from said positions in said first memory means, thereby generating at least part of said interleaved sequence.

17 Claims, 7 Drawing Sheets

US 7,091,889 B2

SPEED AND MEMORY OPTIMIZED INTERLEAVING

RELATED APPLICATION

This application is a 371 of PCT/EP02/10073 filed Sep. 9, 2002.

FIELD OF THE INVENTION

The present invention relates to interleaving in a digital communication system, and in particular to speed and memory optimized interleaving.

DESCRIPTION OF THE PRIOR ART

A transmitter for use in a digital telecommunication system is known, for instance, from 3GPP TS 25.212 V3.4.0 (2000-09) "3rd Generation Partnership Project; Technical Specification Group Radio Access Network; Multiplexing and channel coding (FDD) (Release 1999)", section 4.2. In FIG. 1$a$ of the present application, a block diagram of parts of such a transmitter is given. As shown, the transmitter includes a channel encoder, a rate matcher, an interleaver, and a modulator. Further components (for frequency up-conversion, amplification etc.) are omitted for reasons of conciseness.

CHANNEL ENCODER: The channel encoder, also referred to as forward error correction (FEC) encoder, adds redundant information to each incoming data block. Thereby, the size (length) of the data block increases from K "uncoded" bits, at the encoder input, to L>K "coded" bits at its output. Herein, the size L of the coded data block depends on, at least, the number K of uncoded bits (in the uncoded data block) and a parameter r commonly referred to as the coding rate. With values in the range of 0<r<1, the coding rate r provides an indication of the degree (extent, scope) of redundancy introduced by the channel encoder: the smaller the value of r, the more redundant information is added.

The way, in which redundant information is generated, depends on the channel coding scheme employed. Typical examples are convolutional coding, concatenated convolutional coding such as "turbo" coding, and block coding. Turbo coding will be described below in more detail.

INTERLEAVER: The purpose of the interleaver is to change the order (rearrange) of data bits inside each coded data block in order to ensure that a temporary disturbance during transmission of the data block over the physical channel does not lead to a loss of many adjacent coded data bits, since such a loss in many cases would be unrecoverable at the receiver side. A simple form of interleaving can be obtained by writing an input sequence into an interleaving matrix (memory) in a row-by-row manner and by then reading out therefrom in a column-by-column fashion (or vice-versa). For more sophisticated interleaving variants, so-called permutation "patterns" are commonly used in order to indicate the changes to be performed in the order of bits by providing a relationship between input and output bit positions.

MODULATOR etc.: Upon interleaving, the (baseband) modulator converts the interleaved data bits into symbols which, in general, are complex-valued. Further components, such as digital-to-analog conversion, frequency up-conversion and amplification are not shown in FIG. 1$a$ for conciseness reasons. Finally, a signal is transmitted over the physical channel (air interface, wireline etc.).

Typically, the channel encoding scheme, the inter-leaving scheme, and the modulation scheme are specified in detail by a standard according to which the telecommunication system is to be operated. For example, in third generation (3G) mobile communication standards such as WCDMA (wideband code division multiple access), two channel coding schemes are specified apart from the "no coding" case: convolutional coding and turbo coding. With these coding schemes, several coding rates are to be used (r=½, r=⅓, and others). Also, the uncoded data blocks supplied to the channel encoder may have different sizes K. For these reasons, 3G systems will have to support many different coded data block sizes L_i, i=1, 2, . . . also referred to as different "transport channel types", wherein the block sizes may vary over a wide range (from a few bits to more than 10000 bits, e.g.). On the other hand, due to different physical channel sizes, several interleaving schemes with different interleaver sizes Q_j, j=1, 2, . . . may have to be supported. For example, the WCDMA standard specifies seven different interleaver sizes in the uplink and 17 in the downlink.

In order to match the channel encoder output to a given time slot and/or frame structure, several transport channel types with different (but maybe similar) coded data block sizes L_i should use the same physical channel type (having a given size referred to as target block size in the following).

RATE MATCHER: For this to become possible, a rate matcher is typically inserted between the channel encoder and the interleaver, as shown in FIG. 1$a$. Although it is clear from the above, that a single communication system may have to support several or even many combinations of coded data block sizes L_i and target block sizes Q_j, the following generic description is based, for conciseness reasons, on a single combination of a coded data block size L and a target block size Q. In each coded data block, the rate matcher shown in FIG. 1$a$ either repeats or deletes (removes, "punctures") a certain number of bits in order to obtain a rate-matched data block having a given target block size of Q bits (which is, e.g., the size of an interleaver or a particular block length required for transmission). For this purpose, the rate matcher has to repeat A=Q–L bits of the coded data block, if L is inferior to Q, or to remove (puncture) L–Q=–A bits therefrom, if L is superior to Q, so as to adapt the block size L to said target block size Q. In cases where Q=L, no adjustment in size is necessary, of course.

The positions inside each coded data block, where bits are to be repeated or deleted, are also specified in detail by the standard. With the knowledge of these positions, the receiver will be able to reconstruct a decoded data block from the received data block.

TURBO CODER: As an example for a channel encoder, FIG. 1$b$ shows a turbo coder (TC). Turbo coding is a powerful channel coding method used, for instance, for 3G data services requiring high qualities of service. As is well-known in the art, a turbo coder is a parallel concatenated convolutional coder with at least two constituent encoders and one turbo code interleaver. While the output bits of the constituent encoders usually are referred to as "parity" bits, turbo coders also output the input data "as is". These unaltered output bits of a channel encoder are commonly referred to as "systematic" bits. For the turbo coder (TC) shown in FIG. 1$b$, an exemplary coding rate of r=⅓ was chosen, so that for each input bit, a total of three output bits is generated. The parity bit sequences are generated by the first and second constituent encoders receiving an original and interleaved version, respectively, of the input sequence (uncoded data block), while the systematic bits are passed along the upper horizontal line. It is assumed in FIG.

1b that the encoder output bits are multiplexed into a single bit stream by a switch. However, this multiplexing is for illustrative purposes only. Alternatively, the channel encoder could generate parallel output streams.

WCDMA TC INTERLEAVER: Consider the TC-internal interleaver designated "TC-interl." in FIG. 1b. According to the WCDMA standard, the interleaving scheme for this interleaver is specified as a sequence of steps:

1. Determine the number R of rows and the number C of columns of the interleaving matrix necessary for interleaving an input sequence comprising K bits,
2. Write said input sequence into said R×C interleaving matrix in a row-by-row manner,
3. Determine the intra-row permutation patterns (depending on the row number) and perform the corresponding intra-row permutation operations,
4. Determine the inter-row permutation pattern (one and the same pattern for all columns) and perform the corresponding inter-row permutation operations,
5. Read from said R×C interleaving matrix in a column-by-column manner, thereby generating the interleaved sequence.

Herein, the steps 1–5 include the following operations:

Step 1 (determine R, C): Since the number K of bits in the input sequence (to the TC interleaver) may range from 40 to 5114 bits, the standard specifies a procedure for determining the number R of rows and the number C of columns in the interleaving matrix on the basis of the value of K. More precisely, there can be R=5, 10, or 20 rows in the matrix, depending on the value of K. The determination of the value of C involves the search for a minimum prime p. Herein, p may assume 52 different values ranging from 7 to 257.

Step 2 (write in row-by-row): Once R and C are determined, the input sequence comprising K bits is written into the R×C interleaving matrix in a row-by-row manner starting with the first row (usually having an index of zero).

Step 3 (intra-row permutations): In the third step, an intra-row permutation pattern must be determined for each row before the intra-row permutation operations can take place. For this purpose, a primitive root g0 must be selected from a table in dependence of said minimum prime p. Given the values of g0 and p, base sequences c(i), i=1, 2, ... , p−2 can be determined recursively using modulo operations. Then, a minimum prime integer set $\{q(1), \ldots , q(R-1)\}$ is determined such that the greatest common divisor of q(j) and p−1 is equal to one, wherein q(j)>6, q(j)>q(j−1) and q(0)=1. Finally, the set $\{q(0), \ldots , q(R-1)\}$ is permuted so as to generate a new set $\{p(0), \ldots , p(R-1)\}$ such that p(P(j))=q (j), wherein j=0, 1, ... ,R−1 and P(j) denotes the inter-row permutation pattern determined in step 4 (see below). Then, the intra-row permutation pattern $\{c_j(0), c_j(1), \ldots , c_j(p-2)\}$ for the j-th row is determined as a base sequence, wherein the index depends on i, p(j) and p as follows:

$$c_j(i) = c([i*p(j)] \mod [p-1]) \quad (1)$$

Herein, $c_j(i)$ is the input bit position of the i-th output bit after the permutation of the j-th row.

Step 4 (inter-row permutations): In step 4, the inter-row permutation pattern must be determined before performing the corresponding permutation operations. For this purpose, depending on the values of K and R, one of the following four patterns $P_X = \{P(0), P(1), \ldots , P(R-1)\}$ is selected (X=A, B, C or D), wherein P(j) is the original row index of the j-th permuted row.

$$P_A = \quad (2)$$
$$\{19, 9, 14, 4, 0, 2, 5, 7, 12, 18, 10, 8, 13, 17, 3, 1, 16, 6, 15, 11\},$$
$$P_B = \{19, 9, 14, 4, 0, 2, 5, 7, 12, 18,$$
$$16, 13, 17, 15, 3, 1, 6, 11, 8, 10\},$$
$$P_C = \{9, 8, 7, 6, 5, 4, 3, 2, 1, 0\} \text{ for } R = 10,$$
$$P_D = \{4, 3, 2, 1, 0\} \text{ for } R = 5.$$

Both $P_A$ and $P_B$ can be selected for R=20, depending on the value of K.

Step 5 (read out column-by-column): In the final step, the R×C interleaving matrix containing the bits permuted in steps 3 and 4 is read out in a column-by-column manner starting with the first column (usually having an index of zero). If the number R*C of positions in the interleaving matrix exceeds the number K of bits in the input sequence, a total of R*C−K bits must be pruned (removed) from the sequence thus generated.

INTERLEAVER IMPLEMENTATIONS: As the skilled person will readily appreciate, there are two basic approaches to an interleaver implementation where the interleaving scheme is specified in the form of an algorithm as the one described above.

1. Determine interleaving patterns during the interleaving process as such: In accordance with this approach, denoted A1, the period of time in which interleaving patterns are determined overlaps to a large degree the period of time in which permutation operations are actually performed. In the above example, this would imply to determine R and C first (step 1). Then, the input sequence would be written into the interleaving matrix (step 2). Thereafter, each intra-row permutation pattern would be determined just before performing the corresponding permutation operations (step 3) so that, when considering the entire intra-row permutation process, the periods of time for determining all intra-row patterns and for performing all intra-row permutation operations, coincide to a large extent. Then, the inter-row permutation pattern would be determined so as to be able to perform the inter-row permutation operations (step 4). Finally, the interleaving matrix would be read out (step 5).

In summary, it can be stated that according to approach A1, the operations not directly affecting the bits to be interleaved (such as the operations for determining permutation patterns) and those actually affecting said bits (such as the actual interleaving operations) are performed in essentially the same period of time.

2. Determine interleaving patterns before performing interleaving operations: In this approach, termed A2, the operations for determining the interleaving patterns are separated in time from the actual interleaving operations. This is to say that before the input sequence is actually processed, all interleaving patterns are determined (parts of steps 3 and 4). For each output bit position, the corresponding input bit position is then stored in a position memory so that, once the input sequence has been written into the interleaving matrix (step 2), the interleaved sequence can easily be generated by reading out the bits stored in the interleaving matrix in the order indicated by the positions stored in the position memory.

In summary, according to approach A2, the operations not directly affecting the bits to be interleaved (such as the operations for determining permutation patterns) and those actually affecting said bits (such as the actual interleaving operations) are performed in subsequent periods of time.

Due to the fact that, in accordance with approach A1, all bits of the input sequence must be written into the interleaving matrix (memory) a total of three times (writing into the interleaving matrix two times for permuting in steps 3 and 4 in addition to the initial writing in step 1) before the interleaved sequence can be read out, the approach A1 reveals a rather high delay, defined as the time period between "last bit in" and "first bit out". In addition, the determination (i.e. calculation) of the permutation patterns in steps 3 and 4 further contributes to this delay, because it takes place in essentially the same period of time as the actual permutation operations. On the other hand, the approach A1 does not require an undue size of memory for storing "interim results" such as permutation patterns or other auxiliary parameter values, because they are determined successively as (and only when) required.

In contrast, approach A2 is very memory demanding while delays are modest. Given the fact, that in 3G standards such as WCDMA, the maximum length K of the input sequence amounts to 5114 bits, each position to be stored for later retrieval requires the following number of bits:

$$\log_2 5114 = 12.32 => 13 \text{ bits/position.} \quad (3)$$

Furthermore, a total of 163 different interleavers (interleaving schemes) is specified in WCDMA with an average length of the input sequence of 2500 bits. Therefore, the total number of positions to be stored amounts to $$163 * 2500 = 407500 => 407500 \text{ positions.} \quad (4)$$

The total number of bits necessary to store all positions for all interleavers can easily be calculated by multiplying the values obtained in equations (3) and (4):

$$407500 \text{ positions} * 13 \text{ bits/position} = 5297500 \text{ bits.} \quad (5)$$

In addition to the "data" memory needed anyway for storing the input sequence, A2 thus requires a position memory capable of storing at least 5 Mbit.

In existing implementations, the interleaved sequence is output bit-serially by the interleaver. In view of the high bit rates specified in standards such as WCDMA and considering typical hardware complexity and thus cost requirements, it is not possible to serially process the bits at these high bit rates. In other words, existing interleaving implementations do not support a parallel processing of bits which is a prerequisite to meeting future throughput and delay requirements, as the following example will show. The WCDMA standard specifies services for user data rates of up to 2 Mbit/s. Given the fact that typical implementations are required to support many channels, interleaving would need to operate at a clock rate of 256 MHz. At this clock rate, it would be very difficult to implement the interleaver in FPGA (field programmable gate array) or ASIC (application specific integrated circuit) technology. If, however, a 4 bit parallel processing was possible, the clock rate could be reduced to 64 MHz. The skilled person will readily appreciate that, at this clock rate, the interleaver could be implemented in FPGA or ASIC technology.

As already outlined above, according to 3G mobile communication standards such as WCDMA, interleavers will have to be implemented for many different lengths K of the input sequences and/or many different bit rates. A straightforward solution to this problem would consist in implementing several interleavers according to the prior art and operate them in a parallel manner (different interleavers for different lengths K and/or bit rates). However, such an implementation would lead to a large and complex control logic (using a plurality of counters, memories, etc.) for controlling which input sequence has to be input into which interleaver and for assembling the outputs of the interleavers into a single stream of data. In other words, the implementational effort in terms of the required hardware would exceed typical limitations given for FPGA/ASIC circuits or defined printed circuit board sizes for 3G transceivers.

In view of the above, an interleaver implementation should meet the following requirements:

a) it should minimize the delay as measured for instance in terms of the time difference between "last bit in" and "first bit out";

b) it should minimize hardware complexity; in particular, the size of the required memory should be minimized;

c) it should be capable of coping with a large variety of lengths K of the input sequence varying over a wide range; for example, 3G standards such as WCDMA specify a multitude of K values ranging from 40 to 5114 bits;

d) it should be capable of coping with high input and output bit rates; together with requirement a), such high bit rates may lead to clock rates of 256 MHz;

e) preferably, it should lend itself to a parallel implementation.

SUMMARY OF THE INVENTION

In view of the above, the object of the invention is to develop improved interleaving methods and apparati for interleaving, according to an interleaving scheme, an input sequence comprising $K \geq 2$ bits into an interleaved sequence.

According to the present invention, this object is achieved by an interleaving method having the features of claim 1 and a computer program product having the features of claim 10. It is also achieved by an interleaving unit and an interleaving apparatus having the features of claims 11 and 19, respectively.

According to one aspect of the present invention, first indices of N succeeding bits of the interleaved sequence are generated and then converted, according to an inverse (reverse) of said interleaving scheme, into second indices indicative of the positions where said N succeeding bits of the interleaved sequence are stored in a first memory means (RAM, registers etc.) when (once) they are stored therein. This is, looking at the (not yet known) interleaved sequence, the indices ("first indices") associated with N succeeding bits are generated, i.e. these N bits may or may not be adjacent (neighboring), but they follow each other directly or indirectly so that the first indices will have values which increase somehow (with or without gaps). It is to be noted that N is selectable from values in the range of 1, 2, . . . , K so that both the entire interleaved sequence can be considered (N=K) and arbitrary parts thereof (N<K). Then, the positions where the considered N bits are stored (or will be stored upon writing in) in said first memory means are determined. These positions are indicated by said second indices. Finally, once these positions are known and the input sequence has been stored in (written into) the first memory means, the considered N bits can be read out from said positions in said first memory means, thereby generating, depending on the value of N, at least part of the interleaved sequence.

In summary, it can thus be stated that the index calculations are separated from the actual permutation operations which occur in the final process of reading out only. This advantageously allows to reduce the delay between the time instants of writing in the last input bit and reading out the first output bit. It is to be noted that this reduction in delay does not come at the expense of an increased hardware effort because of the free selectability of N and the modest hardware effort necessary for generating and converting indices.

According to another aspect of the present invention, said first memory means is organized in a matrix form comprising rows and columns, and therefore, the first and second indices can be decomposed into row and column indices each. This allows to separately convert first into second row indices on the one hand and first into second column indices on the other hand, thereby further reducing hardware complexity. This is due to the fact that hereby a two-dimensional interleaving problem has been decomposed into two one-dimensional problems (inter-row and intra-row permutations) while still keeping the benefits due to the separation of the index calculations and the permutation operations.

According to other aspects of the present invention, hardware complexity can be reduced further by pre-calculating and storing selected interim results required for the conversion of the row or column indices. Herein, the interim results are selected such that the hardware effort necessary for storing said interim parameters does not outweigh the hardware effort necessary for processing said interim results so as to obtain the second indices.

According to another aspect of the present invention, N is selected to have a value of essentially K/M with $M \geq 2$ denoting a sub-sampling factor. Herein, said first memory means is adapted to generate an output sequence representing one of M polyphases of said interleaved sequence when said N succeeding bits are read out from said positions. A sub-sampled version of the interleaved sequence is thus generated according to the principles described above. As the output sequence corresponds to the interleaved sequence sub-sampled by a factor of M (and having a given phase), this allows to advantageously operate M interleaving units in parallel. It is to be noted that the expression "a value of essentially K/M" refers to integer values in the close vicinity of the precise value of K/M.

According to another aspect of the present invention, the processes of generating and converting indices are executed, at least partially, before the input sequence is stored in the first memory means. This advantageously allows to further reduce the delay. In this way, the delay can be reduced to almost zero by determining the second indices before the input sequence has been entirely written into the first memory means.

According to another aspect of the present invention, an interleaving apparatus is provided. It includes $M \geq 2$ interleaving units as described above, each adapted to receive said input sequence and to generate an output sequence representing a different one of said M polyphases, a combiner connected to said M interleaving units for combining the output sequences generated by said M interleaving units into said interleaved sequence, and a control unit for controlling the operations of said M interleaving units and said combiner.

This advantageously allows to cope with high input/output bit rates while still keeping the necessary hardware effort at an acceptable level and without sacrificing on the side of the delay properties.

According to another preferred embodiment, there is provided a computer program product directly loadable into the internal memory of a communication unit comprising software code portions for performing the inventive interleaving method when the product is run on a processor of the communication unit.

Therefore, the present invention is also provided to achieve an implementation of the inventive method on computer or processor systems. In conclusion, such implementation leads to the provision of computer program products for use with a computer system or more specifically a processor comprised in e.g., a communication unit.

DESCRIPTION OF THE DRAWINGS

Preferred embodiments of the present invention will, by way of example, be described in the sequel with reference to the following drawings.

In the following description, the same reference numerals are used in order to indicate that the respective block or step has the same (or similar) functionality.

DETAILED DESCRIPTION OF THE INVENTION

Figure 2:
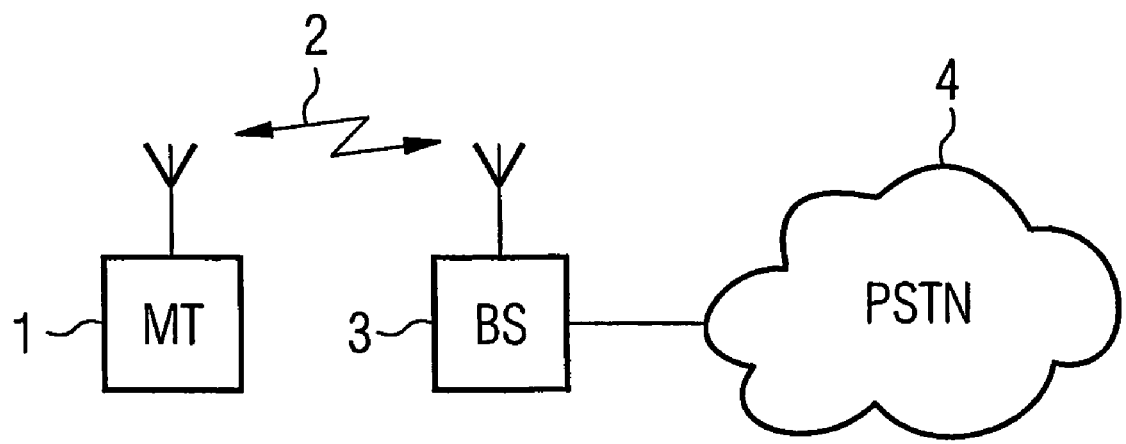
FIG. 2: Block diagram of a radio communication system according to the present invention.

FIG. 2 shows a digital radio telecommunication system according to the invention. A typical application of such a system is to connect a mobile station or mobile terminal (MT) 1 to a core network such as the public switched telephone network (PSTN) 4. For this purpose, the mobile terminal 1 is connected to a base station (BS) 3 via a radio link 2. The radio telecommunication system provides a plurality of base stations which, through other network nodes such as controllers, switches and/or gateways (not shown) are connected to the PSTN 4. Each base station typically supports, at any one time, many radio links 2 towards different mobile terminals 1.

The radio telecommunication system shown in FIG. 2 could for instance be operated according to cellular mobile communication standards such as GSM, PDC, TDMA, IS-95, WCDMA. It should however be mentioned that the invention generally applies to digital telecommunication systems no matter whether they are radio (i.e. wireless) or wireline telecommunication systems. Moreover, the invention also applies to uni-directional ("one-way") communication systems such as broadcasting systems.

Figure 3:
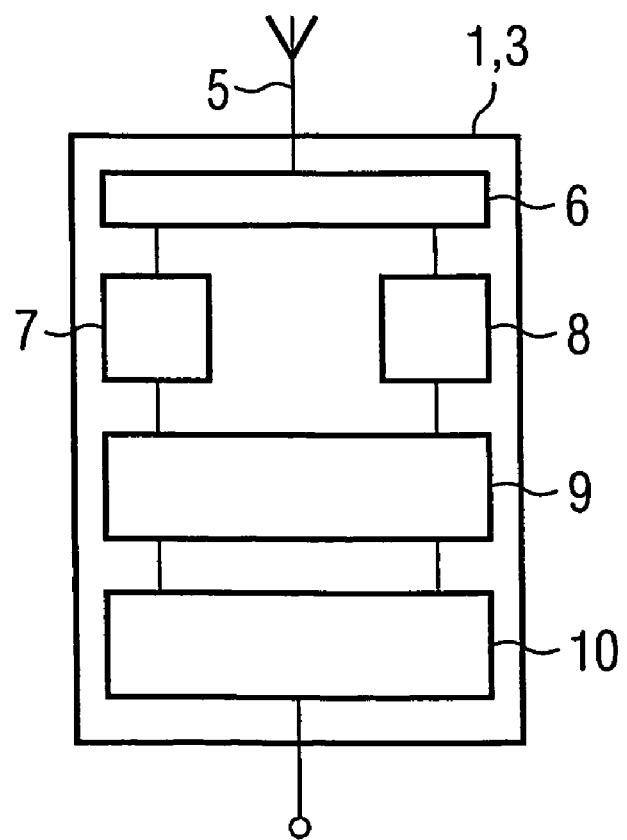
FIG. 3: Block diagram of a transceiver in a radio communication system according to the present invention.

FIG. 3 shows a block diagramme of a transceiver used in mobile terminals and base stations. Both the mobile terminal 1 and the base station 3 are equipped with one (or several)

antenna(s) 5, an antenna duplex filter 6, a radio frequency receiver part 7, a radio frequency transmitter part 8, a baseband processing unit 9 and an interface 10. In case of a base station, the interface 10 is an interface towards a controller controlling the operation of the base station, while in case of a mobile terminal, the interface 10 includes a microphone, a loudspeaker, a display etc., i.e. components necessary for the user interface.

Figure 1A:
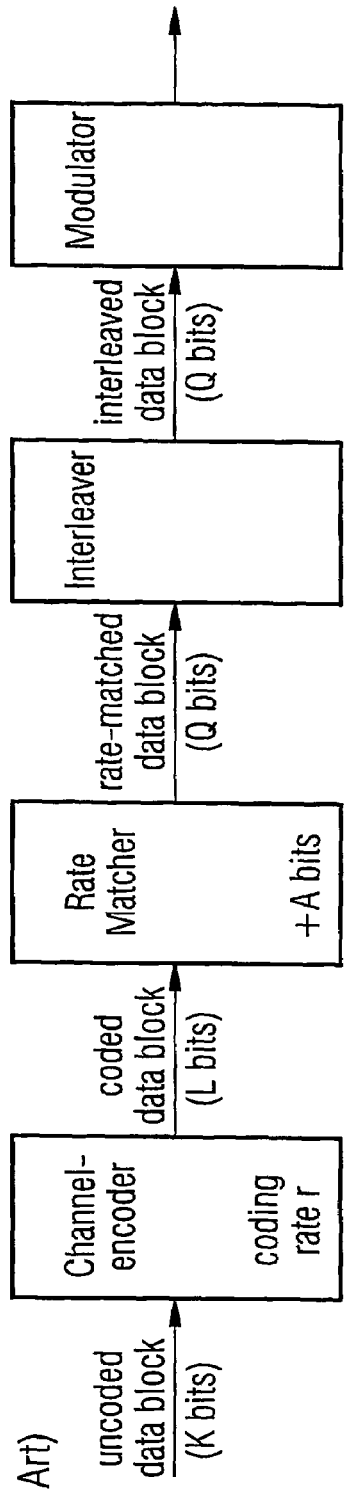
FIG. 1: Block diagram of a transmitter (a) and a turbo coder (b) according to the prior art.
Figure 1B:
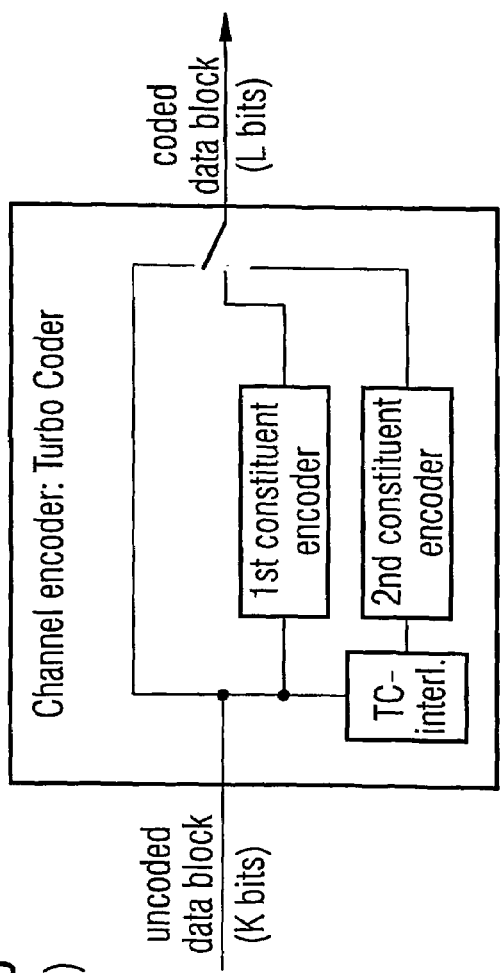

The present invention relates to the baseband processing unit 9, parts of which have already been described above with respect to FIGS. 1a and 1b. The skilled person will readily appreciate that instead of transceivers each having a common baseband processing unit for both the transmission and the reception branches, in uni-directional (broadcasting) communication systems, there are transmitters each including a first baseband processing unit for the transmission branch only and separate receivers each including a second baseband processing unit for the reception branch only. Principally, the invention applies to any such kind of baseband processing units.

More particularly, the present invention relates to interleaving performed in the baseband processing unit 9. Such interleaving may be performed at any stage in the baseband processing unit such as between the channel encoder and the modulator (see the interleaver block of FIG. 1a), within the channel encoder (see FIG. 1b), or even in the reception branch of the baseband processing unit (not shown).

The person skilled in the art will also appreciate that such baseband processing units can be implemented in different technologies such as FPGA (field programmable gate array), ASIC (application specific integrated circuit), DSP (digital signal processor) or other processor technology. In these cases, the functionality of such baseband processing units is described (and thus determined) by a computer program written in a given language such as VHDL, C or Assembler which is then converted into a file suitable for the respective technology.

The concept underlying the improved interleaving approach according to the invention will be explained in the following. It is assumed that an input sequence comprising a number K of bits is to be interleaved, according to a given interleaving scheme, into an interleaved sequence (also comprising K bits). The input sequence may comprise coded bits output by a channel encoder or a rate-matcher (see FIG. 1a), uncoded bits to be encoded (FIG. 1b) or any other kind of bits encountered in a transmitting or receiving branch of a baseband unit.

Figure 4:
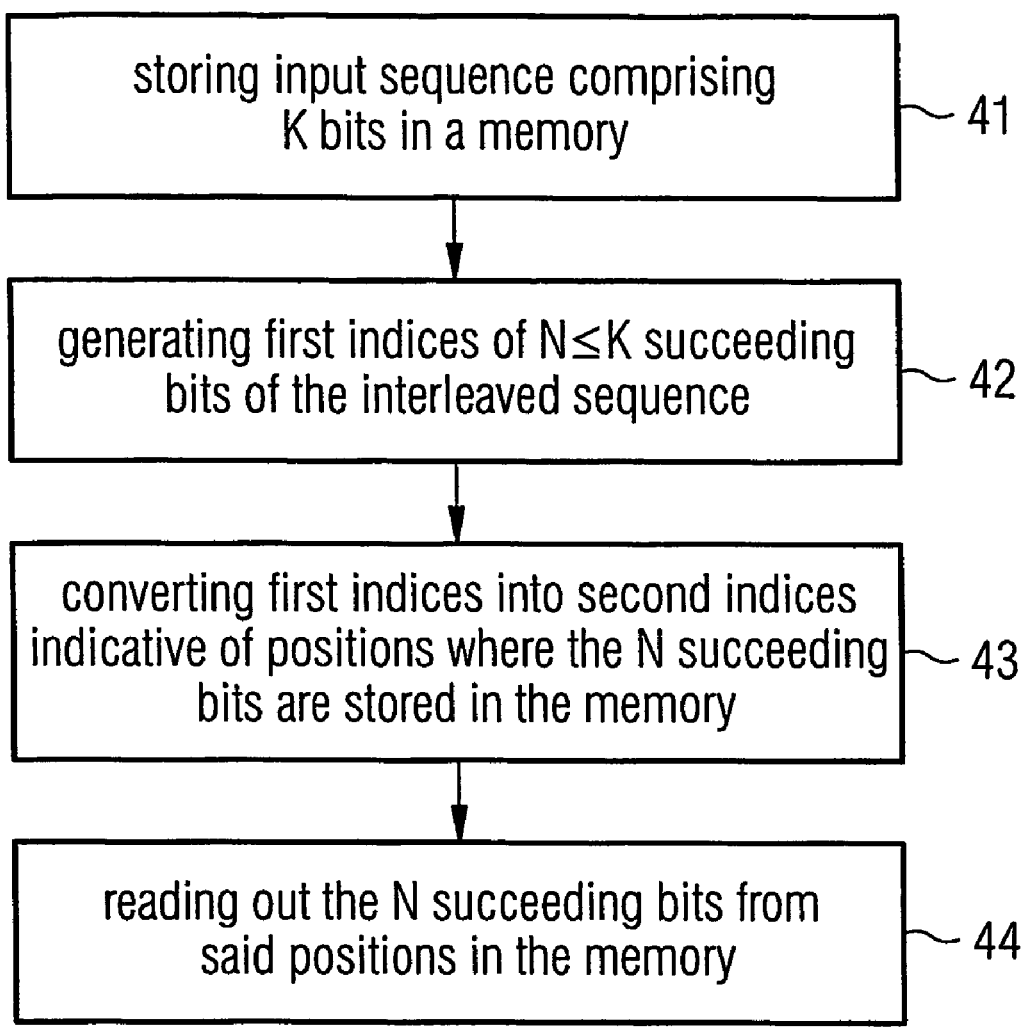
FIG. 4: Flow chart of an interleaving method according to the present invention.

FIG. 4 shows a flow chart of the interleaving method according to the invention. In a first step 41, said input sequence is stored in a memory such as a RAM.

In a second step 42, indices of N succeeding bits of the interleaved sequence are generated, wherein $1 \leq N \leq K$. This is, considering the (yet unknown) interleaved sequence, the indices of N succeeding bits are created. These indices will be referred to as the first indices ia in the sequel. For example, in the case of N=K, the first indices may have the values of, e.g., ia={0, 1, 2, ..., K−1} or {1, 2, 3, ..., K}, depending on whether the first bit of the interleaved sequence is indexed with a value of zero or one. For N=K/2, they may for instance have the values of ia={0, 2, 4, ..., K−2} or {0, 2, 4, ..., K−1} depending on whether K is even or odd, respectively. Preferably, the first indices ia are spaced equidistantly, as shown by the above examples, although in principle any pattern is possible. At the limit, a single (N=1) first index ia may be generated having a particular value.

In general, the first indices ia must relate to succeeding bits of the interleaved sequence so that the first indices will have an increasing order with higher values indicating "later" bits of the interleaved sequence. However, in case the memory is organized in a matrix form (this case will be dealt with below), it may be preferable to express the first indices in the form of row and column indices so that it is difficult to speak of an increasing order in the first indices. Therefore, emphasis must be attached to the fact that the first indices ia relate to succeeding (but not necessarily adjacent/neighboring) bits in the interleaved sequence.

In a third step 43, the first indices ia are converted into second indices ib according to the inverse of said interleaving scheme. Herein, the second indices ib indicate the positions where said N succeeding bits of the interleaved sequence are stored in the memory.

In a fourth step 44, said N succeeding bits of the interleaved sequence are read out from these positions in the memory. Thereby, at least part of said interleaved sequence is generated, depending on the value of N. For N=K, the full interleaved sequence comprising K bits is generated in step 44, while for N<K, only that part of the interleaved sequence is generated which is identified by the first indices ia. In case of equidistantly spaced first indices ia, a subsampled version of the interleaved sequence is generated. Depending on the value of the first one of said first indices ia, this version has a particular phase and can thus be referred to as one of the polyphases of the interleaved sequence.

As the skilled person will readily appreciate, step 41 could also be executed after (or during) step 42 or even after (or during) step 43. In the latter case, the index calculations (steps 42 and 43) would be performed before (or while) storing the input sequence (step 41). Clearly, step 41 must be executed before step 44, however.

Figure 5:
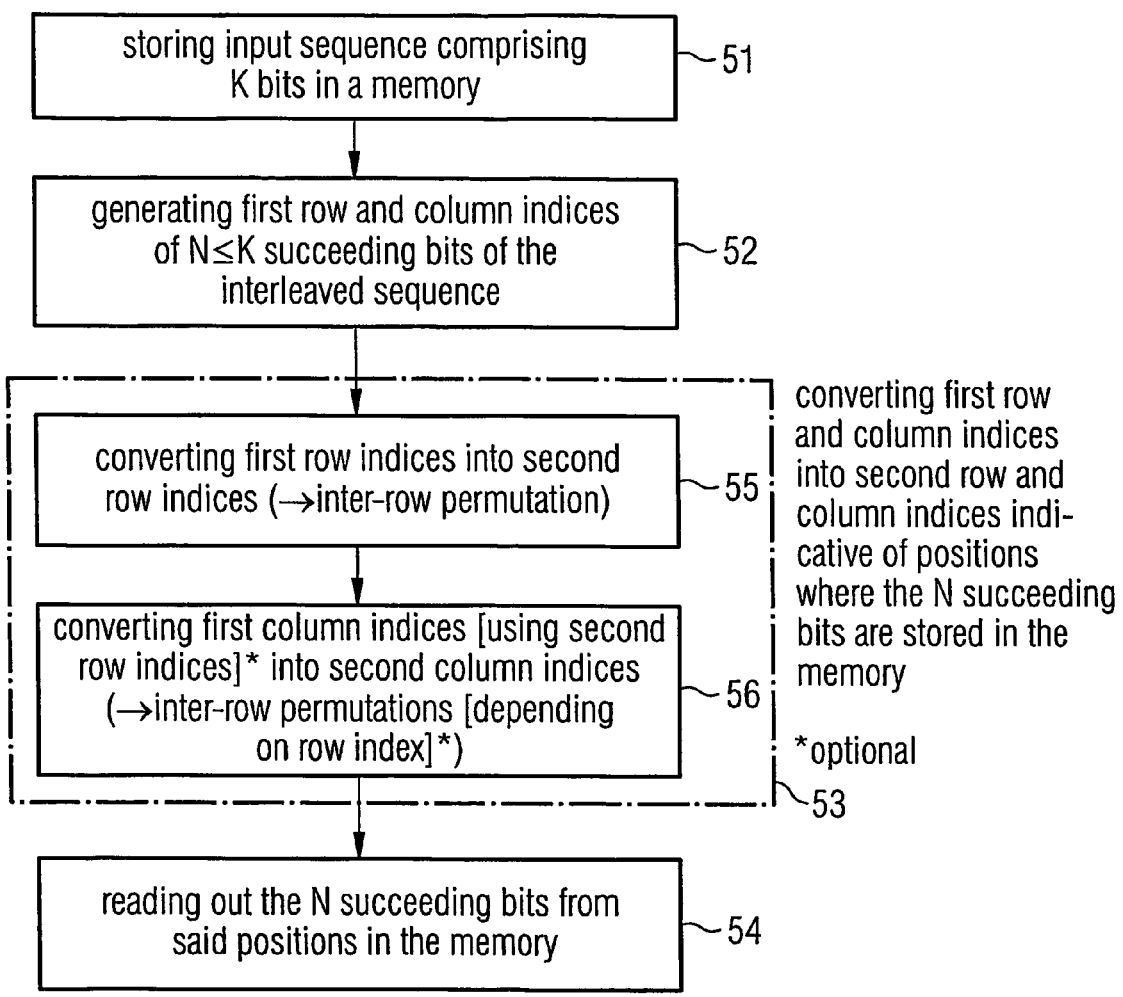
FIG. 5: Flow chart of an alternative interleaving method according to the present invention.

FIG. 5 provides a preferred embodiment of the interleaving method described above with respect to FIG. 4. Herein, it is assumed that the memory is organized in a matrix form, wherein each memory location is indexed (can be addressed) by a row index and a column index. For this reason, said first and second indices, explained above with respect to FIG. 4, also comprise row and column indices. In particular, it is assumed in FIG. 5 that the first indices ia comprise first row indices ra and first column indices ca, while the second indices ib comprise second row indices rb and second column indices cb. Depending on whether column-wise or row-wise reading out/writing in is required, the relation between a first index ia as explained above with respect to FIG. 4 and corresponding ones of the first row indices ra and the first column indices ca can be expressed as $$ia = ca*R + ra; \quad (6)$$

or $$ia = ra*C + ca, \quad (7)$$

wherein R and C denote the number of rows and columns in the interleaving matrix (memory), ra ranges from 0 to R−1 and ca ranges from 0 to C−1. As the skilled person will appreciate, a corresponding relation links the second row and column indices (rb,cb) with the second indices (ib).

The steps 51, 52, and 54 in FIG. 5 correspond to the steps 41, 42, and 44, respectively, shown in FIG. 4. However, instead of generating "linear" first indices ia (step 42 of FIG. 4), first row and column indices (ra, ca) are now generated in step 52 of FIG. 5. Similarly, the index conversion step 53 still converts first (row and column) indices into second (row and column) indices indicative of the positions where the N succeeding bits are stored in the memory. However, it now includes two substeps 55 and 56. In the first substep 55, the first row indices ra (generated in step 52) are converted into the second row indices rb such that, when executing said step of reading out (step 54), an inter-row permutation operation (the same for all columns) is performed for those bits of the interleaved sequence identified by said first row and column indices ra, ca. In a second substep 56, which is executed after substep 55, the first column indices ca (generated in step 52) and the second row indices rb (generated in step 55) are converted into the second column indices cb such that, when executing said step of reading out (step 54), an intra-row permutation operation depending on the row index is performed for the bits of the interleaved sequence identified by said first row and column indices ra, ca. The second row and column indices rb, cb are of course equivalent to the second indices ib, as explained above.

As the skilled person will readily appreciate, the substeps 55 and 56 will depend on the interleaving scheme which is typically specified in a standard. For example, FIG. 5 is adapted to the WCDMA standard specifying that, first, an intra-row permutation operation has to be performed, wherein the permutation pattern depends on the row number (i.e. it may be different for each row) and, secondly, an inter-row permutation operation is to be performed using the same permutation pattern for all columns, as described above with respect to the prior art. Of course, other variants can easily be conceived. If, for example, an inter-row permutation is to be performed before an intra-row permutation, the second column indices would have to be determined before the second row indices. Similarly, an additional input may be necessary for the substeps where a permutation pattern is not to be the same for all rows or columns. For these reasons, the features of step 53 which very much depend on the interleaving scheme and thus are optional, i.e. the second row indices in step 56, are shown in brackets.

Before providing more detail on the row index conversion and the column index conversion, some interleaving apparati adapted to execute the steps of the interleaving methods described above with respect to FIGS. 4 and 5 will be described with reference to FIGS. 6 to 8.

Figure 6:
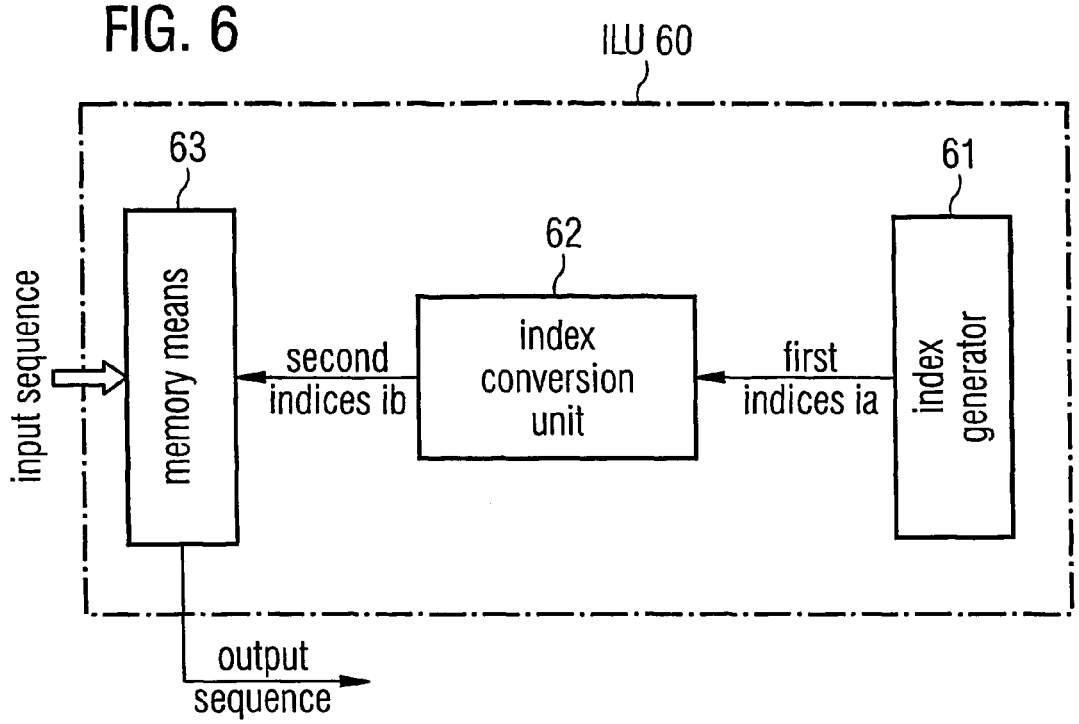
FIG. 6: Block diagram of an interleaving unit according to the present invention.

FIG. 6 shows a block diagram of an interleaving unit (ILU) 60 adapted to execute the steps of the interleaving method described above with respect to FIG. 4. It includes an index generator 61, an index conversion unit 62 connected to said index generator 61, and a memory means 63 connected to said index conversion unit 62 as well as to the input and the output terminals of said ILU 60.

The index generator 61 is adapted to generate the first indices ia as described above with respect to step 42 of FIG. 4. It may include one or several counters or similar devices. The index conversion unit 62 is suitable for converting first indices ia into second indices ib as described above with respect to step 43 of FIG. 4. The memory means 63 (such as one or several RAMS, registers etc.) is adapted to receive and store said input sequence comprising K bits (cf. step 41 of FIG. 4). An output sequence can be retrieved (i.e. read out) from the memory means 63 (and thus from the ILU 60) by addressing it with the second indices ib output by the index conversion unit 62. Herein, the output sequence comprises at least part of said interleaved sequence, depending on the value of N, as described above with respect to step 44 of FIG. 4.

As described above with respect to FIG. 4, the input sequence can be stored in the memory means 63 before, during, or after the second indices are output by the index conversion unit 62. Reading out from the memory means 63 can however be done only after the second indices have been output, of course.

Figure 7:
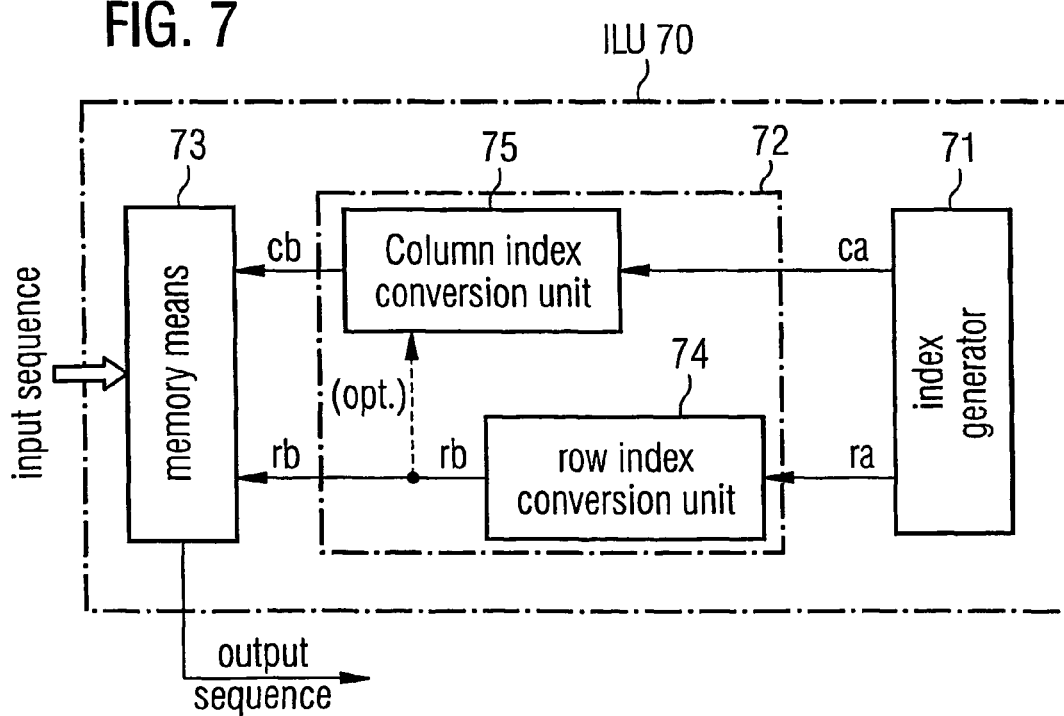
FIG. 7: Block diagram of an alternative interleaving unit according to the present invention.

FIG. 7 provides a preferred embodiment of the interleaving unit described above with respect to FIG. 6. It shows a block diagram of an interleaving unit (ILU) 70 adapted to execute the steps of the interleaving method described above with respect to FIG. 5. Just as in FIG. 5, it is assumed in FIG. 7 that the memory is organized in a matrix form having R rows and C colums and that the first and second indices each comprise row and column indices, as described above with respect to FIG. 5.

In accordance with the ILU 60 of FIG. 6, the ILU 70 shown in FIG. 7 includes an index generator (71), an index conversion unit (72) connected to said index generator, and a memory means (73) connected to said index conversion unit as well as to the input and the output terminals of said ILU 70.

However, in contrast to FIG. 6, both the first and the second indices comprise row and column indices in FIG. 7. For this reason, the index generator 71 is adapted to execute step 52 of FIG. 5 (rather than step 42 of FIG. 4), i.e. to generate the first row indices ra and the first column indices ca. Preferably, it therefore include at least two counters or similar devices. Likewise, while still converting first indices into second indices indicative of the positions where the N succeeding bits are stored in the memory, the index conversion unit 72 is adapted to execute step 53 of FIG. 5 (rather than step 43 of FIG. 4), i.e. to convert first row and column indices into second row and column indices. For this purpose, it includes a row index conversion unit 74 and a column index conversion unit 75, each connected to both the index generator 71 and the memory means 73 (see FIG. 7).

Herein, the row index conversion unit 74 is adapted to convert the first row indices ra generated by the index generator 71 into the second row indices rb such that, when reading out said memory, an inter-row permutation operation (the same for all columns) is performed for those bits of the interleaved sequence identified by said first row and column indices ra, ca. In other words, the row index conversion unit 74 is adapted to execute step 55 of FIG. 5.

The column index conversion unit 75 is adapted to convert the second row indices rb generated by said row index conversion unit 74 and the first column indices ca generated by the index generator 71 into the second column indices cb such that, when reading out said memory, an intra-row permutation operation depending on the row index is performed for the bits of the interleaved sequence identified by said first row and column indices ra, ca. For this reason, the column index conversion unit 75, which is thus adapted to execute step 56 of FIG. 5, is also connected to the row index conversion unit 74.

The second row and column indices rb and cb are then output by the units 74 and 75, respectively, in order to address the memory means 73 so as to generate the output sequence.

Similar to the details of the step 53 shown in FIG. 5, the details of the index conversion unit 72 depend on the specified interleaving scheme. For the details of the index conversion unit 72 of FIG. 7, the WCDMA standard was assumed with its sequence of 'intra-row permutation with varying patterns, then inter-row permutation with the same pattern' as described above with respect to FIG. 5. For this reason, the column index conversion unit 75 requires the second row indices rb (determined by the row index conversion unit 74) as an input in addition to the first column indices ca in order to be able to determine the second column indices cb, while said row index conversion unit 74 directly converts the first into the second row indices without requiring further indices. Of course, other variants can easily be conceived for the index conversion unit 72. If, for example, an inter-row permutation using varying patterns is to be performed before an intra-row permutation using the same pattern, the second column indices cb output by the column index conversion unit 75 would have to be input into the row index conversion unit 74 to enable it to convert the first row indices ra into the second row indices rb. For these reasons, the features of the index conversion unit 72 which very much depend on the interleaving scheme and thus are optional, i.e. the rb input to the column index conv. unit 75, are indicated by dashed lines in FIG. 7.

Figure 8:
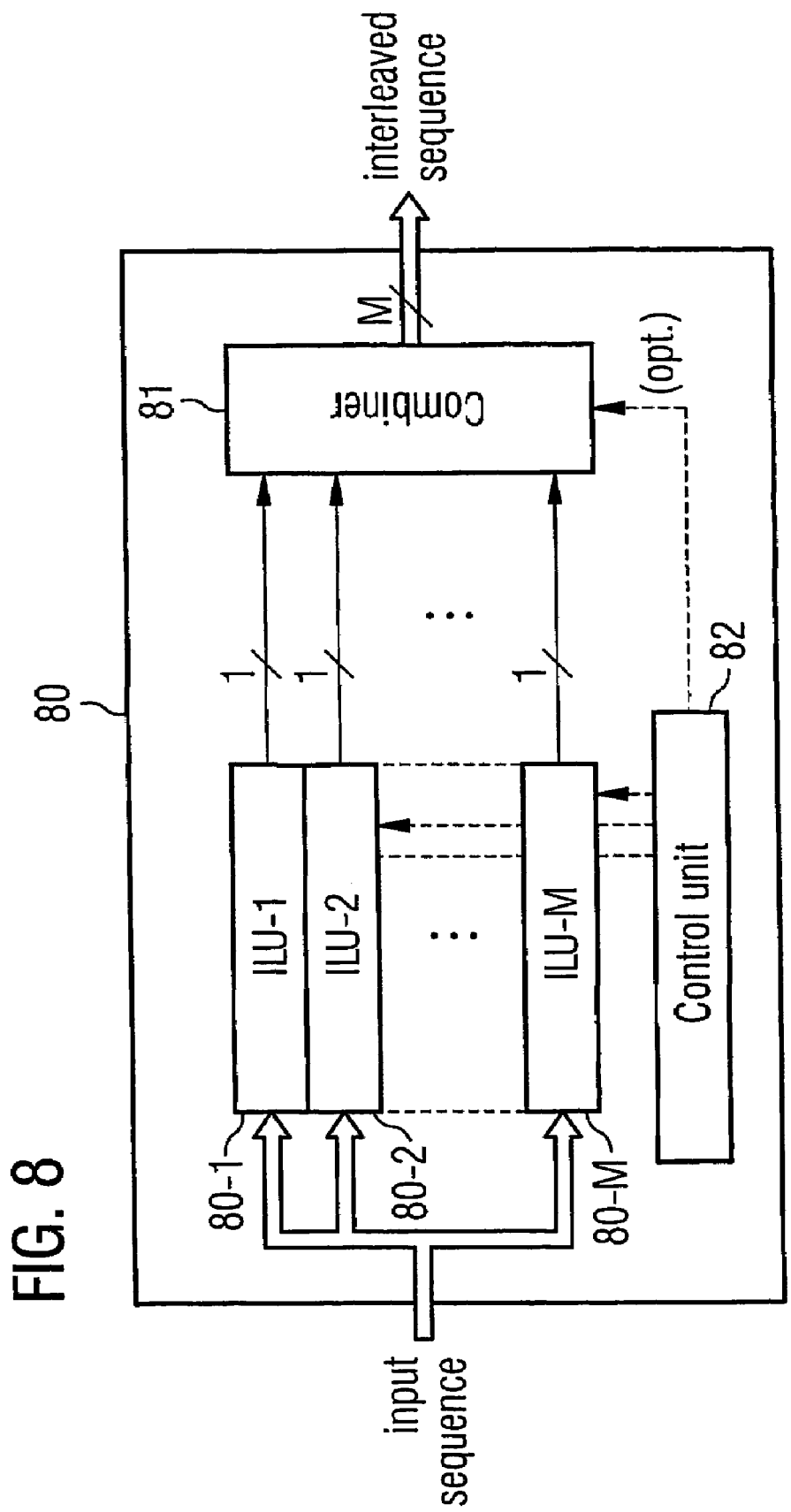
FIG. 8: Block diagram of an interleaving apparatus comprising parallel interleaving units according to the present invention.

FIG. 8 shows a block diagram of an interleaving apparatus 80 according to the invention. It includes a total of M parallel interleaving units 80-1, 80-2, . . . , 80-M, a combiner 81 connected to said interleaving units, and a control unit 82. Advantageous interleaving units have already been described above with respect to FIGS. 6 and 7. The combiner 81 is adapted to combine (assemble) the output sequences generated by the interleaving units 80-1, 80-2, . . . , 80-M into said interleaved sequence.

As the skilled person will readily appreciate, M can in general have any integer value. In case of M=1, however, a single interleaving unit (ILU) generates the entire interleaved sequence so that no combiner is necessary. In case of interleavers used in WCDMA applications, typical values for M are four or eight.

The control unit 82 is adapted to control the operations of the interleaving units and/or the combiner. For this purpose, values of auxiliary parameters required by the interleaving units are determined by the control unit on the basis of certain input parameters such as, e.g., the number K of bits in the input sequence.

According to FIG. 8, each ILU is adapted to receive the same input sequence comprising K bits. However, the first indices ia (and thus the second indices ib, too) generated in each interleaving unit vary from ILU to ILU and do not have any common members while making sure that, for each of the K bits of the interleaved sequence, a first index ia is generated in one of the M interleaving units.

In a preferred embodiment, each ILU generates an output sequence representing a different one of the M (poly)phases of the interleaved sequence so that the number M of interleaving units could also be referred to as a sub-sampling factor. For the generation of (poly)phases, the first indices ia generated within the different ILUs may for example be chosen as follows ILU-1 (80-1): $ia=\{0, M, 2^*M, 3^*M, \ldots\}$, ILU-2 (80-2): $ia=\{1, M+1, 2^*M+1, 3^*M+1, \ldots\}$, ILU-3 (80-3): $ia=\{2, M+2, 2^*M+2, 3^*M+2, \ldots\}$, ILU-M (80-M): $ia=\{M-1, 2^*M-1, 3^*M-1, \ldots\}$, provided that the index associated with the first bit of the interleaved sequence is zero. As can be seen from the above example, the first indices ia of a pair of ILUs differ from each other only by a constant offset value s so that the above equations can be summarized as follows:

$$ILU\text{-}(s+1): ia=\{s, M+s, 2^*M+s, \ldots\}, s=0, 1, \ldots, M-1. \quad (8)$$

The number of first indices per ILU amounts to N=K/M in this preferred embodiment.

The skilled person will readily appreciate that the number M of interleaving units typically is determined as the result of a trade-off between the necessary hardware resources and the required operating frequency. In general, the higher the value of M, the more hardware resources (in terms of the number of gates or logic cells, size of ASIC area etc.) are necessary. However, for a given bit rate of the input sequence, the higher the value of M, the slower each ILU is permitted to operate. For very high bit rates such as those specified in the WCDMA standard, the maximum operating frequency for a given hardware technology (such as FPGA, ASIC, DSP) typically entails a minimum value for M necessary in order to reduce the operating frequency of each ILU to a realizable level.

In the following, preferred embodiments suitable for an application in a WCDMA turbo code interleaver (cf. the above description with respect to the prior art) are described. Herein, an interleaving apparatus according to FIG. 8 is assumed, wherein M=4 parallel interleaving units (ILUs) 80-1, 80-2, 80-3, and 80-4 are applied in order to generate the four polyphases of the interleaved sequence. For each of these ILUs, the block diagram given in FIG. 7 is supposed to hold, wherein the memory means is organized in a matrix form having R=10 rows and C=53 columns. A preferred index generator 71 will be detailed first, while advantageous row and column index conversion units 74, 75 will be described afterwards with respect to FIGS. 9 and 10.

Preferably, the index generator 71 includes two counters, a row counter for generating the first row indices ra={0, 1, . . . , R−1=9} and a column counter for generating the first column indices ca={0, 1, . . . , C−1=52}. Given a value of M=4, it is clear that the "linear" first index ia must be incremented by four in each clock period. While this applies to all ILUs, each different ILU must use a different offset s ranging from 0 for the first ILU 80-1 to M−1=3 for the last ILU 80-4. For example, for the first ILU with s=0, we may have ia={0, 4, 8, 12, 16, . . . }. In terms of the first row and column indices ra and ca, respectively, these values of ia translate as follows (cf. equation (6)):

| ia | 0 | 4 | 8 | 12 | 16 | 20 | 24 | 28 | 32 | . . . | 524 | 528 |
|----|---|---|---|----|----|----|----|----|----|-------|-----|-----|
| ra | 0 | 4 | 8 | 2  | 6  | 0  | 4  | 8  | 2  | . . . | 4   | 8   |
| ca | 0 | 0 | 0 | 1  | 1  | 2  | 2  | 2  | 3  | . . . | 52  | 52  |

From the above example, it can be seen that the row counter in ILU 80-(s+1) has to start with the offset value s and that it is incremented by M in each clock period (where the result is subject to a "modulo R" operation). In contrast, the column counter starts with a zero value and is incremented by one each time the row counter is reduced as a result of the modulo operation.

The above example applies to a row-wise writing in of the input sequence. As the skilled person will readily appreciate, in case of a column-wise writing in, the parameters relating to rows must be replaced with corresponding ones relating to columns and vice-versa.

Figure 9:
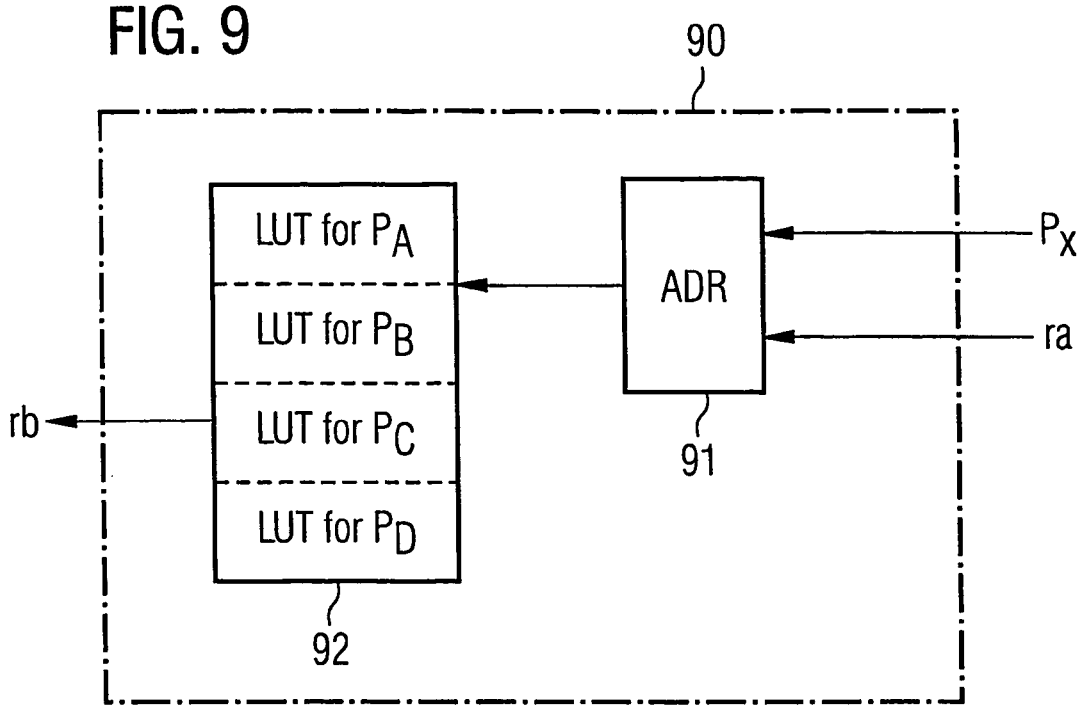
FIG. 9: Block diagram of a row index conversion unit according to the present invention.

FIG. 9 depicts a block diagram of a preferred embodiment 90 of the row index conversion unit 74 shown in FIG. 7 for converting first row indices ra into second row indices rb. It includes an addressing means ADR 91 and a memory means 92 connected to said addressing means 91.

In the memory means 92, which may be a ROM, an EPROM etc., the inter-row permutation patterns $P_A, P_B, P_C, P_D$ are stored in the form of a look-up table (LUT). For this purpose, the memory means 92 must be able to store 55 values (20 for $P_A$ and $P_B$ each, 10 for PC and 5 for PD, as can be seen from equations (2)), i.e. the LUT must have 55 addresses. Each value can be represented by 5 bits (data width), so that the total number of bits to be stored in the memory means 92 amounts to $$55*5 \text{ bits}=275 \text{ bits}, \tag{9}$$

only.

Based on the auxiliary parameter $P_X$ and a first row index ra, the addressing means ADR 91 determines an address for appropriately addressing said memory means 92 so that it outputs a corresponding second row index rb indicative of the row where the bits of the interleaved sequence having the row index ra are stored in the memory means 73 of FIG. 7. Herein, the auxiliary parameter $P_X$ is used to select one of said permutation patterns $P_A, P_B, P_C, P_D$ (by a corresponding offset address value, e.g.), whereas the first row index ra is used to identify a particular value of said selected permutation pattern.

As explained above with respect to the prior art, the value of the auxiliary parameter $P_X$ depends on the number R of rows ($P_X=P_D$ for R=5, $P_X=P_C$ for R=10) and possibly the number K of bits in the input sequence ($P_X=P_A$ or $P_B$ for R=20, depending on the value of K). Based on these parameters, the value of $P_X$ can for example be determined by a control unit in the interleaving unit or apparatus, such as the control unit 82 shown in FIG. 8, and then input into the row index conversion unit(s) of the interleaving unit(s).

Figure 10:
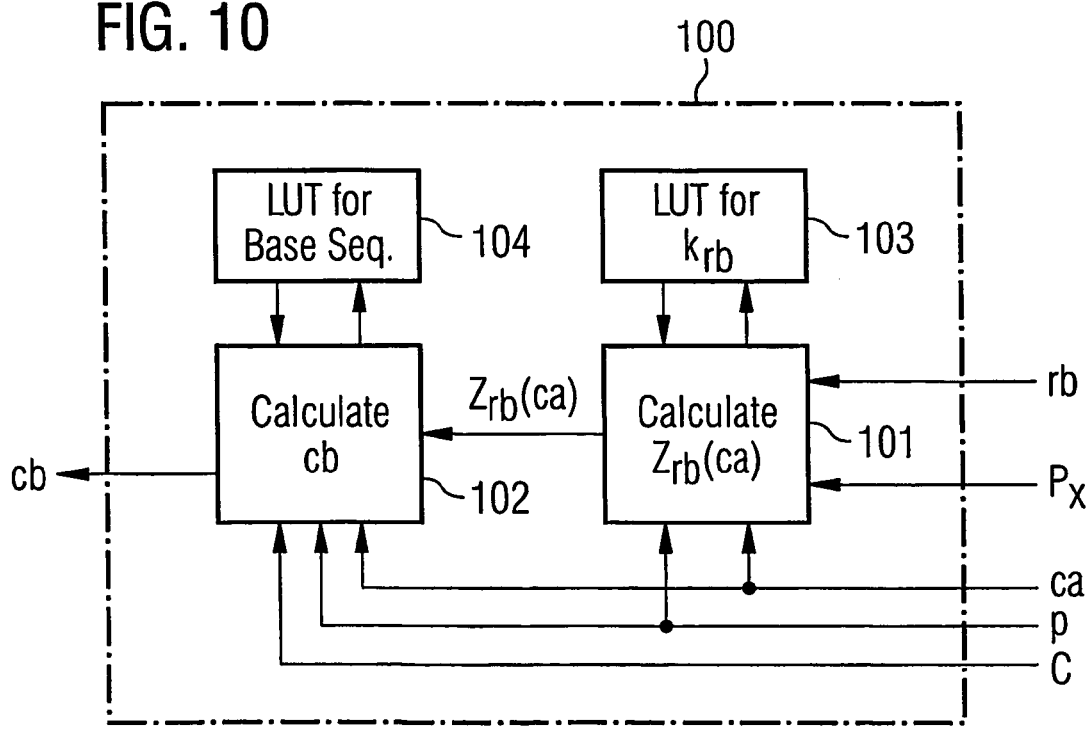
FIG. 10: Block diagram of a column index conversion unit according to the present invention.

FIG. 10 depicts a block diagram of a preferred embodiment 100 of the column index conversion unit 75 shown in FIG. 7 for converting first column indices ca (and second row indices rb) into second column indices cb. It includes two memory means 103, 104 and two processing means 101, 102. Herein, the first processing means 101 is connected to the memory means 103, while the second processing means 102 is connected to the first processing means 101 and the memory means 104.

The first processing means 101 determines an auxiliary parameter $Z_{rb}(ca)$ mainly depending on the first column index ca and the second row index rb, while the second processing means 102 determines the second column index cb on the basis of, among other parameters, the first column index ca and the auxiliary parameter $Z_{rb}(ca)$. Herein, the auxiliary parameter $Z_{rb}(ca)$ can be obtained from equation (1) (see the above description relating to the prior art), wherein ca and rb are used in place of the indices i and j, respectively $$Z_{rb}(ca)=c([ca*p(rb)]mod\ [p-1]),\ ca=0, 1, \ldots, p-2. \tag{10}$$

In equation (10), p, p(rb), and c( . . . ) denote the minimum prime, a member of the new set $\{p(0), \ldots, p(R-1)\}$, and a base sequence, respectively, as described above with respect to the prior art. Given the fact that the first column index ca is incremented in steps of one (see above), equation (10) can be formulated recursively $$Z_{rb}(ca)=Z_{rb}(ca-1)+k_{rb}\ \text{with}\ Z_{rb}(0)=0, \tag{11}$$

wherein the following applies:

$$k_{rb}=p(rb)\text{mod}(p-1), \tag{12}$$

$$\text{if}\ Z_{vrb}(ca) \geq p-1,\ \text{then}\ Z_{rb}(ca) \leftarrow Z_{rb}(ca)-(p-1). \tag{13}$$

Herein, the auxiliary parameter $k_{rb}$ depends on rb, p, and $P_X$ (cf. the above description of FIG. 9). The values of $k_{rb}$ are therefore pre-calculated according to equation (12) for all possible values of rb, p, $P_X$, and stored in the memory means 103 (ROM, EPROM etc.) in the form of a look-up table LUTk. For this purpose, the memory means 103 must be able to store 55 values (20 for $P_A$ and $P_B$ each, 10 for $P_C$ and 5 for $P_D$, as can be seen from equations (2)) for each of the 52 possible values of p, i.e. the LUTk must have 55*52=2860 addresses. For an assumed maximum p value of 257, the data width needs to be 8 bits (max. value 255) so that the total number of bits to be stored in the memory means 103 amounts to $$2860*8\ \text{bits}=22880\ \text{bits}. \tag{14}$$

Similarly, the base sequences c( . . . ) as described above with respect to the prior art are pre-calculated for all 52 possible values of p and stored in the memory means 104 (ROM, EPROM etc.) in the form of a look-up table LUTc. Note that for a particular value of p, the corresponding base sequence comprises p values. For this reason, the memory means 104 must be able to store a total of $p_1+p_2+\ldots+p_{52}=6328$ values, i.e. the LUTc must have 6328 addresses. Assuming again a maximum p value of 257, the required data width is 9 bits (max. value 256) so that the total number of bits to be stored in the memory means 104 amounts to $$6328*9\ \text{bits}=56952\ \text{bits}. \tag{15}$$

Operatively, on the basis of the input parameters $P_X$ and p, the first processing means 101 addresses the memory means 103 so as to read therefrom the 5, 10, or 20 corresponding values of $k_{rb}$ for all possible values of rb. For a given value of ca, these values of $k_{rb}$ are then added to the corresponding values $Z_{rb}(ca-1)$ according to equation (11) in order to determine, again for all possible values of rb, the values of $Z_{rb}(ca)$, while observing equation (13). Finally, one of the $Z_{rb}(ca)$ values is selected by a multiplexer, e.g., as indicated by the input parameter rb, and then output by the first processing means 101.

Depending on the values of the first column index ca and the minimum prime p, the second processing means 102 determines the second column index cb according to Table 1, wherein R and C denote the number of rows and columns, respectively, in the memory means 73 of FIG. 7.

TABLE 1

| case | cb generation | |
|---|---|---|
| a) C = p | cb = LUTc($Z_{rb}$(ca)) | for ca = 0, 1, . . ., C−2 |
| | cb = 0 | for ca = C−1 |
| b) C = p+1 | cb = LUTc($Z_{rb}$(ca)) | for ca = 0, 1, . . ., C−3 |
| | cb = 0 | for ca = C−2 |
| | cb = p | for ca = C−1 |
| IF K = R × C | cb = p | for ca = 0 |
| AND rb = R−1 | cb = LUTc($Z_{rb}$(ca)) | for ca = 1, 2, . . ., C−3 |
| | cb = 0 | for ca = C−2 |
| | cb = LUTc($Z_{rb}$(0)) | for ca = C−1 |
| c) C = p−1 | cb = LUTc($Z_{rb}$(ca))−1 | for ca = 0, 1, . . ., C−1 |

If necessary according to Table 1, the memory means 104 (LUTc) is addressed appropriately using the $Z_{rb}(ca)$ value (or $Z_{rb}(0)$) output by the first processing means 101 as an index to the appropriate base sequence c( . . . ) so as to retrieve the second column index cb indicative of the column where the bits of the interleaved sequence having the row index ra and the column index ca are stored in the memory means 73 of FIG. 7.

As the skilled person will readily appreciate, the memory means 92, 103, and 104 shown in FIGS. 9 and 10 as parts of the row and column index conversion units, respectively, can of course be placed outside these (then purely logic) units but inside the index conversion unit 72 of FIG. 7, or even outside the index conversion unit (62,72) but inside the interleaving unit ILU (60,70) in FIG. 6 or 7. In the latter case, a unified memory means (including the memory means 92, 103, and 104) connected to the index conversion unit (62,72) could be added inside the ILU (60,70). In addition, the index conversion unit would then be adapted to perform logic operations only so that it could be referred to as a logic mit.

When M>1 parallel interleaving units 80-1, . . . , 80-M are provided according to FIG. 8, the question arises whether a single unified memory means (including the memory means 92, 103, and 104 for all ILUs) could be placed outside the interleaving units and connected thereto so that no memory means would be required inside the interleaving units. Although this is possible in principle, this measure increases implementational complexity. Since all M interleaving units would have to access the single unified memory means within each cycle, this memory means would be required to either have M ports allowing for M simultaneous read accesses or to be operable at M times the original operating frequency. In both cases, hardware complexity increases so that, normally, a single unified memory means will not be realized. However, interim solutions including both a common (large) "top-level" memory means outside the interleaving units and a (small) ILU-internal memory means in each ILU may be advantageous, as will be described below.

In the following, it is evaluated in how far the requirements formulated in the above section on the prior art are met, in the example considered above, by the interleaving approach according to the invention, as described above with respect to FIGS. 4 to 10.

From the above description with respect to FIGS. 9 and 10, it can be concluded that an interleaving unit (ILU) according to FIG. 6 or 7 requires memory means 92, 103, and 104 capable of storing a total of (cf. equations (9), (14), and (15))

$$275 \text{bits} + 22880 \text{bits} + 56952 \text{bits} = 80107 \text{bits} \tag{16}$$

in addition to the "data" memory means required anyway (memory means 63/73 of FIG. 6/7).

Compared with approach A2 (as described above with respect to the prior art) requiring a position memory capable of storing 5297500 bits according to equation (5), the interleaving unit according to the invention thus reduces the memory requirement by a factor of 5297500/80107=66, or equivalently, more than 98%.

With respect to the delay requirement, the following can be stated. Once the input sequence has been written into the memory means 63,73, no further access to said memory means 63,73 is necessary before reading out the first bit of the interleaved sequence, because, according to the invention, the process of determining indices (reflecting the necessary permutations) has been decoupled from the actual permutation/interleaving operations.

At the limit, the delay between "last bit in" and "first bit out" can be reduced to almost zero by making sure (through an appropriate timing) that the second indices (ib; rb,cb) for the first bit of the interleaved sequence are available at the address inputs of the memory means 63,73 by the time the last bit of the input sequence is written into the memory means 63,73 so that, one cycle later, the first bit of the interleaved sequence can be read out from the corresponding position of the memory means 63,73.

With respect to approach A1 as described in the above section on the prior art, wherein the bits of the input sequence are written into the memory means two times in addition to the initial writing-in, a dramatic reduction in delay is thus achieved by the invention.

In comparison with approach A2, the invention achieves equally good delay properties. In contrast with A2, however, these good delay properties are not achieved at the expense of increased memory sizes, as shown above.

When incorporating M parallel interleaving units (ILUs) according to the invention into an interleaving apparatus as shown in FIG. 8, a trade-off involving the total hardware effort, the operating frequency and/or the input/output bit rate is possible. Either the operating frequency of the ILUs can be reduced by a factor of M while still being able to cope with the original bit rate, or alternatively, the bit rate can be increased by a factor of M if the operating frequency remains unchanged. In other words, this means that high bit rates, as required by advanced communication standards such as WCDMA, can be coped with conveniently (by using parallel ILUs according to FIG. 8) due to the relatively small implementational effort associated with each ILU according to the invention. Assuming that, according to equation (16), each ILU requires memory means capable of storing a total of 80107 bits, an interleaving apparatus comprising M such ILUs will require storage of $$M*80107 \text{ bits}, \tag{17}$$

which, for typical values of M (4, 8, or 16) is still well below the memory sizes required by approach A2, let alone the fact that, normally, the memory sizes required by A2 also multiply by a factor of M as a result of parallelization due to the multiple access problem described above.

It is to be noted that in a parallel configuration according to FIG. 8, the required total memory size can be reduced well below the value indicated in equation (17). This is due to the fact that in the memory means 103, 104, base sequences and $k_{rb}$ values are stored for all 52 possible values of the minimum prime p, although only those base sequences and $k_{rb}$ values for a particular p value are needed by the processing means 101, 102 and thus by the interleaving units for interleaving a given input sequence.

For this reason, a common (large) "top-level" memory means adapted to store the base sequences and $k_{rb}$ values for all possible values of p could be provided outside the interleaving units of FIG. 8, while it would be sufficient for each ILU to include a small memory means adapted to store only those base sequences and $k_{rb}$ values required by the processing means 101, 102 for a particular p value. Operatively, the ILU-internal small memory means would then download, during an initial phase, the base sequences and $k_{rb}$ values required for a particular p value from the common top-level memory means. As all ILUs would download the same blocks of base sequences and $k_{rb}$ values (p is the same for all ILUs), this would not pose any problems of multiple accesses to the common top-level memory means. In this way, the size of the memory means 103 in each ILU (inside or outside the index conversion unit) can be reduced by a factor of 52, leading to $$22880 \text{ bits}/52 = 440 \text{ bits} \tag{18}$$

according to, and in comparison with, equation (14), while the size of the memory means 104 in each ILU (inside or outside the index conversion unit) can be reduced to $$257*9 \text{ bits} = 2313 \text{ bits}, \tag{19}$$

which is the number of bits necessary to store the longest base sequence having 257 values. Thus, the small ILU-internal memory means must be adapted to store $$440 \text{ bits} + 2313 \text{ bits} = 2753 \text{ bits}, \tag{20}$$

so that the entire interleaving apparatus according to FIG. 8 requires storage of $$80107 \text{ bits} + M*2753 \text{ bits}, \quad (21)$$

in contrast to equation (17). Herein, it has been assumed that the inter-row permutation patterns are also stored only once in the common top-level memory means rather than in each ILU (cf. the memory means 92 of FIG. 9), although the effect in memory reduction is negligible compared with the one obtained by storing only the required base sequences and $k_{rb}$ values in each ILU. Finally, it is to be noted that the overall memory size indicated in equation (21) is well inferior to the one shown in equation (17) for all values of $M \geq 2$.

Further, from the description given above with respect to the present invention it is clear that the present invention also relates to a computer program product directly loadable into the internal memory of a digital communication unit (such as a transceiver or transmitter of a base station or a mobile phone etc.) for performing the steps of the inventive interleaving approach in case the product is run on a processor of the digital communication unit.

Therefore, this further aspect of the present invention covers the use of the inventive concepts and principles for optimised interleaving within, e.g., mobile phones and base stations adapted to future applications. The provision of the computer program products allows for easy portability of the inventive concepts and principles as well as for a flexible implementation in case of re-specifications of the interleaving scheme(s).

The foregoing description of preferred embodiments has been presented for the purpose of illustration and description. It is not intended to be exhaustive or to limit the invention to the precise form disclosed. Obvious modifications or variations are possible in the light of the above technical teachings. The embodiments have been chosen and described to provide the best illustration of the principles underlying the present invention as well as its practical application and further to enable one of ordinary skill in the art to utilize the present invention in various embodiments and with various modifications as are suited to the particular use contemplated. All such modifications and variations are within the scope of the invention as determined by the appended claims.

LIST OF IMPORTANT PARAMETERS

| | |
|---|---|
| C: | Number of columns in the interleaving matrix |
| ca: | First column indices |
| cb: | Second column indices |
| c(i): | Base sequence |
| $\{c_j(i)\}$: | Intra-row permutation pattern for row index j |
| ia: | First indices |
| ib: | Second indices |
| K: | Number of bits in the input sequence |
| $k_{rb}$: | Auxiliary parameter for the recursive determination of $Z_{rb}(ca)$ |
| M: | Number of parallel ILUs in the interleaving apparatus; subsampling factor |
| N: | number of succeeding bits of the interleaved sequence, for which indices are generated in the index generator/generating step. |
| p: | minimum prime |
| $P_A, P_B, \ldots$: | Inter-row permutation patterns |
| $P_X$: | Indication of a particular inter-row pattern |
| R: | Number of rows in the interleaving matri |
| ra: | First row indices |
| rb: | Second row indices |
| $Z_{rb}(ca)$: | Indices to base sequences |

LIST OF ABBREVIATIONS

| | |
|---|---|
| 3G: | third generation |
| 3GPP: | third generation partnership project |
| ASIC: | Application specific integrated circuit |
| BS: | Base station |
| DSP: | Digital signal processor |
| ETSI: | European Telecomm. Standardization Institute |
| FDD: | Frequency division duplex |
| FPGA: | Field programmable gate array |
| GSM: | Global system for mobile communications |
| IL: | Interleaver |
| ILU: | Interleaving unit |
| IS-95: | Interim Standard 95 |
| LUT: | Look-up table |
| MT: | Mobile terminal/station |
| MUX: | Multiplexer |
| PDC: | Personal digital cellular (system) |
| PSTN: | Public switched telephone network |
| RAM: | Random access memory |
| ROM: | Read-only memory |
| TC: | Turbo code(r) |
| TDMA: | Time division multiple access |
| TIL: | Turbo Interleaver |
| TS: | Technical specification |
| WCDMA: | Wideband code division multiple access |

The invention claimed is:

1. A method, for use in a digital communication system, for interleaving input data having $K \geq 2$ bits according to an interleaving scheme into an interleaved sequence, said method comprising the steps of:
   a) storing the input data in a first memory means;
   b) generating first indices of N succeeding bits of the interleaved sequence;
   c) converting, according to an inverse of said interleaving scheme, said first indices into second indices indicative of the positions where said N succeeding bits of the interleaved sequence are stored in said first memory means; and,
   d) reading out said N succeeding bits from said positions in said first memory means, thereby generating at least part of said interleaved sequence;
   wherein N is selected to have a value of K/M with $M \geq 2$ denoting a sub-sampling factor, and wherein said first memory means is adapted to generate an output sequence representing one of M polyphases of said interleaved sequence when said N succeeding bits are read out from said positions.

2. The method according to claim 1, wherein:
   said first memory means is organized in a matrix form comprising rows and columns;
   said first indices comprise first row indices and first column indices; and,
   said second indices comprise second row indices and second column indices; and, wherein said step of converting comprises the steps of:
   converting said first row indices into said second row indices so that inter-row permutation operations according to said interleaving scheme are performed when said step of reading out is executed; and,
   converting said first column indices into said second column indices so that intra-row permutation operations according to said interleaving scheme are performed when said step of reading out is executed.

3. The method according to claim 2, wherein said step of converting said first row indices comprises the steps of:

storing at least one permutation pattern defining said inter-row permutation operations in a second memory means; and, addressing said second memory means with addresses depending on at least said first row indices, causing said second memory means to output said second row indices.

4. The method according to claim 2, wherein said step of converting said first column indices comprises the step of:

converting said first column indices and said second row indices into said second column indices so that intra-row permutation operations depending on a row index are performed when said step of reading out is executed.

5. The method according to claim 4, wherein said step of converting said first column indices comprises the steps of:

determining base sequence indices depending on said first column indices and said second row indices by adding index increments depending on said second row indices to previously determined base sequence indices; and, determining said second column indices on the basis of at least said first column indices and said base sequence indices.

6. The method according to claim 5, wherein said step of converting comprises the steps of:

storing at least said index increments in a third memory means;

storing at least one base sequence specified by said interleaving scheme in a fourth memory means; wherein said step of determining base sequence indices is adapted to address said third memory means so as to read therefrom said index increment; and, said step of determining said second column indices is adapted to address said fourth memory means so as to read therefrom corresponding values of said at least one base sequence.

7. The method according to claim 1, wherein N is selected to have a value of K, and wherein said first memory means is adapted to generate said interleaved sequence when said N succeeding bits are read out from said positions.

8. The method according to claim 1, wherein said steps of generating and converting are executed, at least partially, before said step of storing.

9. An interleaving apparatus, for use in a digital communication system, for interleaving input data having $K \geq 2$ bits according to an interleaving scheme into an interleaved sequence, said apparatus comprising:

a) an index generator for generating first indices of N succeeding bits of the interleaved sequence;

b) an index conversion unit connected to said index generator for converting, according to an inverse of said interleaving scheme, said first indices into second indices indicative of the positions where said N succeeding bits of the interleaved sequence are stored in a first memory means; and, c) first memory means connected to said index conversion unit, wherein said first memory means is adapted to store said input sequence and to generate at least part of said interleaved sequence when said N succeeding bits are read out from said positions;

wherein N is selected to have a value of K/M with $M \geq 2$ denoting a sub-sampling factor, and wherein said first memory means is adapted to generate an output sequence representing one of M polyphases of said interleaved sequence when said N succeeding bits are read out from said positions.

10. The interleaving apparatus according to claim 9, wherein:

said first memory means is organized in a matrix form comprising rows and columns;

said first indices comprise first row indices and first column indices;

said second indices comprise second row indices and second column indices; and, wherein said index conversion unit includes:

a row index conversion unit for converting said first row indices into said second row indices so that inter-row permutation operations according to said interleaving scheme are performed when said N succeeding bits are read out from said positions in said first memory means; and, a column index conversion unit for converting said first column indices into said second column indices so that intra-row permutation operations according to said interleaving scheme are performed when said N succeeding bits are read out from said positions in said first memory means.

11. The interleaving apparatus according to claim 10, further comprising:

second memory means for storing at least one permutation pattern defining said inter-row permutation operations; and, wherein said row index conversion unit includes addressing means for addressing said second memory means with addresses depending on at least said first row indices, thereby causing said second memory means to output said second row indices.

12. The interleaving apparatus according to claim 10, comprising:

$M \geq 2$ interleaving units, each adapted to receive said input sequence and to generate an output sequence representing a different one of said M polyphases;

a combiner connected to said M interleaving units for combining the output sequences generated by said M interleaving units into said interleaved sequence; and, a control unit for controlling the operations of said M interleaving units and said combiner.

13. The interleaving apparatus according to claim 12, further comprising:

fifth memory means, connected to said M inter-leaving units, for storing at least one of a complete set of base sequences according to the interleaving scheme and a complete set of base sequence index increments.

14. The interleaving apparatus according to claim 10, wherein said column index conversion unit comprises:

means for converting said first column indices and said second row indices into said second column indices so that intra-row permutation operations depending on a row index are performed when said N succeeding bits are read out from said positions in said first memory means.

15. The interleaving apparatus according to claim 14, wherein said column index conversion unit includes:

first processing means for determining base sequence indices depending on said first column indices and said second row indices by adding index increments depending on said second row indices to previous base sequence indices;

second processing means, connected to said first processing means, for determining said second column indices on the basis of at least said first column indices and said base sequence indices determined by said first processing means.

16. The interleaving apparatus according to claim 15, further comprising:
   third memory means, connected to said first processing means, for storing at least said index increments;
   fourth memory means, connected to said second processing means, for storing at least one base sequence specified by said interleaving scheme; wherein:
   said first processing means is adapted to address said third memory means so as to read therefrom said index increments; and,
   said second processing means is adapted to address said fourth memory means so as to read therefrom corresponding values of said at least one base sequence.

17. The interleaving apparatus according to claim 9, wherein N is selected to have a value of K, and wherein said first memory means is adapted to generate said interleaved sequence when said N succeeding bits are read out from said positions.

* * * * *

UNITED STATES PATENT AND TRADEMARK OFFICE
CERTIFICATE OF CORRECTION

PATENT NO. : 7,091,889 B2 Page 1 of 1
APPLICATION NO. : 10/526519
DATED : August 15, 2006
INVENTOR(S) : Kukla et al.

It is certified that error appears in the above-identified patent and that said Letters Patent is hereby corrected as shown below:

In Column 13, Line 54, after "ILU-3 (80-3): ia= {2, M+2, 2*M+2, 3*M+2, ... }" insert -- : --.

In Column 15, Line 1, delete "PC" and insert -- $P_C$ --, therefor.

In Column 15, Line 1, delete "PD" and insert -- $P_D$ --, therefor.

In Column 15, Line 63, Equation 13, delete "$Z_{vrb}(ca) \geq p-1$," and insert -- $Z_{rb}(ca) \geq p-1$ --, therefor.

In Column 17, Line 8, delete "mit" and insert -- unit --, therefor.

In Column 19, under "LIST OF IMPORTANT PARAMETERS", Line 19, delete "matri" and insert -- matrix --, therefor.

Signed and Sealed this

Eighteenth Day of December, 2007

JON W. DUDAS
*Director of the United States Patent and Trademark Office*